(12) United States Patent
Maruyama et al.

(10) Patent No.: US 6,426,900 B1
(45) Date of Patent: Jul. 30, 2002

(54) SYNCHRONOUS SEMICONDUCTOR MEMORY DEVICE PERFORMING DATA OUTPUT IN SYNCHRONIZATION WITH EXTERNAL CLOCK

(75) Inventors: Yukiko Maruyama; Seiji Sawada, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/907,589

(22) Filed: Jul. 19, 2001

(30) Foreign Application Priority Data

Feb. 6, 2001 (JP) ......................................... 2001-029676

(51) Int. Cl.$^7$ .................................................. G11C 7/00
(52) U.S. Cl. .................... 365/194; 365/203; 365/189.05
(58) Field of Search .................................. 365/194, 233, 365/189.05

(56) References Cited

U.S. PATENT DOCUMENTS 6,212,127 B1 * 4/2001 Funaba ........................ 365/233

FOREIGN PATENT DOCUMENTS

| JP | 2-232950 | 9/1990 |
| JP | 10-112182 | 4/1998 |
| JP | 11-191020 | 7/1999 |

* cited by examiner

*Primary Examiner*—A. Zarabian
(74) *Attorney, Agent, or Firm*—McDermott, Will & Emery

(57) ABSTRACT

A DLL circuit generates a control clock specifying an operating timing of a data output buffer according to an external clock. The DLL circuit includes a replica delay time adjusting section and a phase control section. The phase control section controls such that a feedback clock and the external clock becomes in phase. The replica delay time adjusting section adjusts a delay time of the feedback clock behind the control clock according to an operating condition serving as a factor for changing a processing time of the data output buffer.

13 Claims, 8 Drawing Sheets

SYNCHRONOUS SEMICONDUCTOR MEMORY DEVICE PERFORMING DATA OUTPUT IN SYNCHRONIZATION WITH EXTERNAL CLOCK

BACKGROUND OF THE INVENTION

1. Field of the Invention

The present invention relates to a synchronous semiconductor memory device and more particularly, to a synchronous semiconductor memory device including a DLL (Delay Locked Loop) circuit for operating in synchronization with an external clock.

2. Description of the Background Art

Requirements for a high speed operation of a synchronous semiconductor memory device have been leveled up in recent years and in order to cope with such leveled-up requirements, a synchronous semiconductor memory device has been developed that performs data input/output in synchronization with an external clock, which is represented by an SDRAM (Synchronous Dynamic Random Access Memory). In a synchronous semiconductor memory device, a DLL circuit for generating a control clock in synchronization with an external clock is included and data input/output is performed at timings in synchronization with the control clock generated.

As a typical example of a specification for a synchronous semiconductor memory device, there is an access time tAC for defining a time period from an output timing determined according to an external clock till data is actually outputted. Generation of the control clock in the DLL circuit, therefore, is required be performed so as to satisfy a specification of the access time period tAC.

FIG. 13 is a timing chart for describing a data output operation in a general synchronous semiconductor memory device.

Referring to FIG. 13, a synchronous semiconductor memory device performs a data output operation, taking in a read command supplied externally at a timing in synchronization with an external clock EXTCLK which repeats a combination of a high level (hereinafter simply referred to as H level) and a low level (hereinafter simply referred to as L level) in a constant cycle.

At a time point t0, a read command READ for instructing a read operation is inputted according to a combination of signal levels of command control signals represented by a column address strobe signal EXTZCAS in synchronization with a rise timing of the external clock EXTCLK.

If a setting value of a column latency of the synchronous semiconductor memory device is two clock cycles (CL=2), data output to the outside is requested at a time point t1 when two clock cycles of the external clock EXTCLK elapse after a time point t0. Hence, a difference between a time point at which data is actually outputted and the time point t1 is requested to satisfy a specification for the access time tAC.

A DLL circuit included in the synchronous semiconductor memory device delays the external clock EXTCLK by one clock cycle or a plurality of clock cycles to generate a feedback clock FBCLK. That is, the DLL circuit performs phase control such that the feedback clock FBCLK and the external clock EXTCLK become in phase with each other.

A data output buffer performing data output to the outside operates in response to a control clock DLLCLK generated by DLL. In the inside of the DLL circuit, a phase of the feedback clock FBCLK lags behind the control signal DLLCLK by a replica delay time Tdr.

Therefore, if the replica delay time Tdr is determined in correspondence to a data processing time in the data output buffer, a timing at which data is actually outputted from the data output buffer can be made closer to the time point t1.

On the other hand, as one of general operating conditions for a synchronous semiconductor memory device, a word organization indicating the number of bits of data communicated with the outside in a one time data input/output operation is set. In the present specification, a setting of a word organization in which N bit data N is a natural number) is communicated in a one time data input/output operation is expressed by "×N" hereinafter.

In FIG. 13, shown is a case where the replica delay time Tdr in the DLL circuit is set so as to be equal to a buffer processing time Tdb (×4) in a case of a word organization ×4. In this case, an access time tAC when a word organization is ×4 can be set to tAC=0.

As shown in FIG. 13, however, if a setting of the word organization is altered and the number of bits communicated in a one time data input/output operation increases, a processing time in the output buffer increases. That is, when the word organization is set to ×8 and ×16 in two ways, processing times Tdb (×8) and Tdb (×16) become longer than a processing time Tdb (×4) in a case of a word organization ×4 by ΔTdb1 and ΔTdb2, respectively.

This is because as the number of bits of data outputted in one time increases, a tendency arises that an operating current of the data output buffer increases and with the increase in the operating current, an operating power source voltage of the data output buffer falls.

On the other hand, in a prior art DLL circuit, it has been common that the replica delay time is set to a fixed value; therefore, there was a problem since an access time varies if an operating condition represented by a word organization alters.

That is, as shown in FIG. 13, if a replica delay time Tdr in the DLL circuit is adjusted in correspondence to a case of a word organization ×4, there has arisen a problem that changes in the processing time ΔTdb1 and ΔTdb2 show up as changes in the access time tAC, as they are, without being compensated in a case where word organizations are set ×8 and ×16, respectively.

In general, setting of the word organization is performed by wire bonding in an assembly step; therefore, a prior art configuration in which a replica delay time Tdr in a DLL circuit is fixed in a fabrication process of a chip has had difficulty securing an proper access time while securing a degree of freedom in setting of the word organization.

On the other hand, a configuration is also conceived in which stability of an operating power source voltage of a data output buffer is raised such that a processing time in the data output buffer does not alter even if the word organization is altered. In this case, however, stabilization capacitor with large capacitance is required to be provided to the operating power source voltage, which places a burden on a layout design.

SUMMARY OF THE INVENTION

It is accordingly an object of the present invention to provide a configuration of a synchronous semiconductor memory device capable of performing data output at a proper timing-according to setting of an operating state represented by a word organization.

The present invention will be summarized as follows: The present invention is a synchronous semiconductor memory device operating in synchronization with an external clock and includes: a data output buffer circuit; and a control clock generating circuit. The data output buffer circuit performs an output operation of read data to the outside, requiring a processing time corresponding to an operating condition. The control clock generating circuit generates a control clock activating an output operation of the data output buffer circuit according to an external clock. The control clock generating circuit includes: a delay circuit for delaying the external clock to generate the control clock; a delay control section controlling a delay time in the delay circuit according to a phase difference between the external clock and a feedback clock; and a replica delay time adjusting section, provided between the delay circuit and the delay control circuit, and for delaying the control clock by a replica delay time corresponding to the processing time to generate the feedback clock. The replica delay time adjusting section adjusts the replica delay time according to an operating condition.

Therefore, a main advantageous point of the present invention is that an operating timing of the data output buffer circuit can be set, reflecting a change in the processing time of the data output buffer circuit corresponding to an operating condition. As a result, a data output timing can be properly set in each of various operating conditions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention below with reference to the accompanying drawings. Note that the same symbols used in the following description indicate the same or corresponding constituents.

First Embodiment

Figure 1:
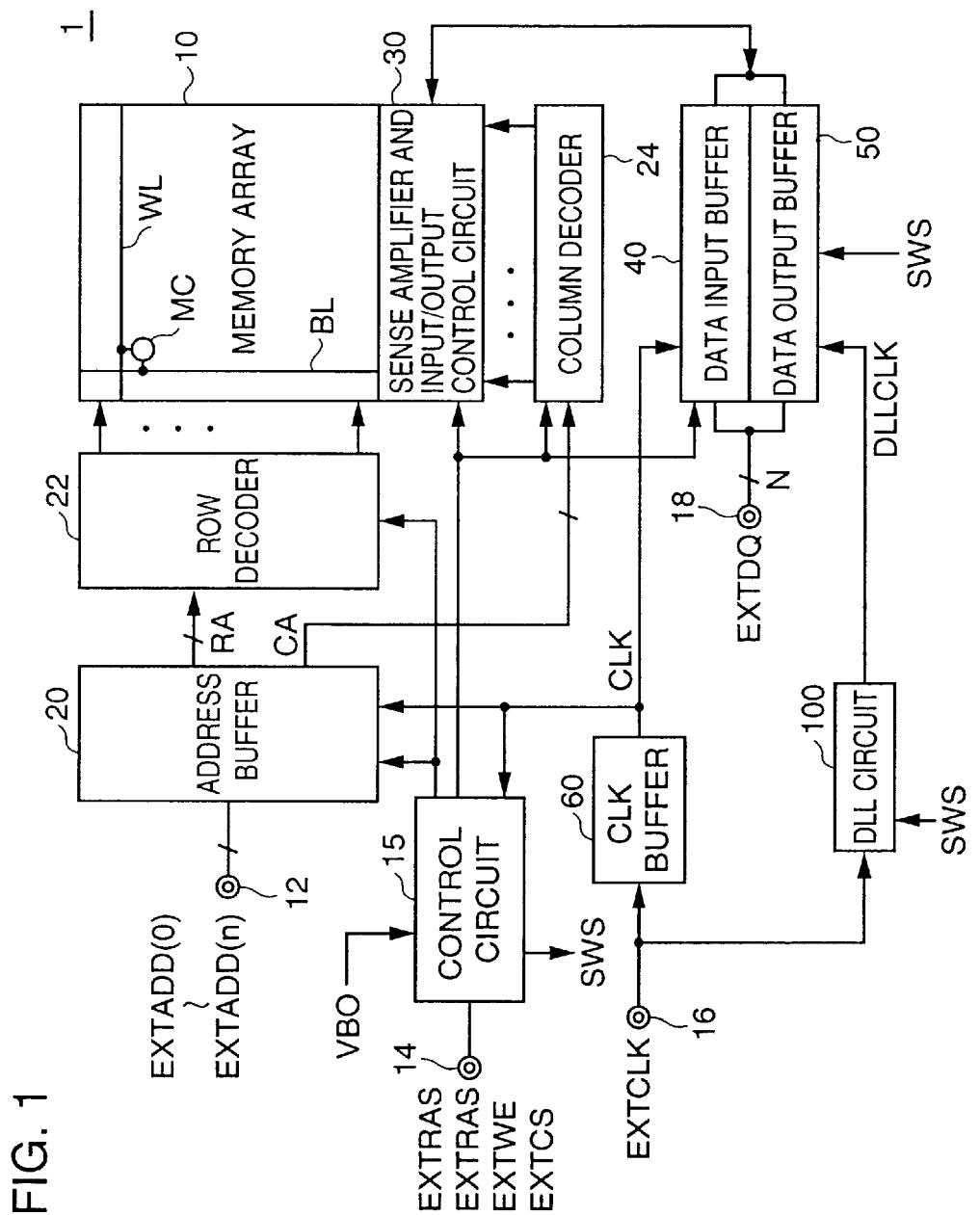
FIG. 1 is a schematic block diagram showing an overall configuration of a synchronous semiconductor memory device according to a first embodiment.

Referring to FIG. 1, a synchronous semiconductor memory device 1 according to the first embodiment includes: a memory array 10; an address terminal 12; a command control signal terminal 14; a control circuit 15; a clock terminal 16; and a data terminal 18.

The memory array 10 includes a plurality of memory cells MC arranged in the form of a matrix. Word lines are disposed correspondingly to respective rows of memory cells and bit lines are disposed corresponding to respective columns of memory cells. In FIG. 1, typically shown is arrangement of a word line WL and a bit line BL of one memory cell.

To the address terminal 12, inputted are an address signal constituted of address bits EXTADD (0) to EXTADD (n), where n is a natural number, and for performing address selection in the memory array 10. To the command control signal terminal 14, inputted are external signals: a row address strobe signal EXTZRAS, a column address strobe signal EXTZCAS, a write enable signal EXTZWE and a chip select signal EXTZCS.

To the clock terminal 16, an external clock EXTCLK is inputted. Through the data terminal 18, data EXTDQ is communicated with the outside. The number N (N is a natural number) of bits of data EXTDQ supplied/received in a one time input/output operation is determined according to the setting of a word organization. A word organization in the synchronous semiconductor memory device 1 can be selectively set, for example, by a bonding option in an assembly step. In the synchronous semiconductor memory device 1, a word organization can be selectively set to any of ×4, ×8 and ×16.

The control circuit 15 controls all of operations of the synchronous semiconductor memory device 1 according to the group of signals inputted thereto. To the control circuit 15, inputted is a bonding option voltage VBO determined according to the presence or absence of bonding coupling between a prescribed bonding pad and a prescribed voltage terminal.

The control circuit 15 outputs a word organization setting signal SWS reflecting a set word organization according to the boding option voltage VBO when power is turned on. The word organization setting signal SWS is constituted of a signal of one bit or a plurality of bits.

The synchronous semiconductor memory device 1 further includes: an address buffer 20; a row decoder 22; a column decoder 24; a sense amplifier and an input/output circuit 30; a data input buffer 40; and a data output buffer 50.

The address buffer 20 generates a row address RA and a column address CA according to an address signal inputted to the address terminal 12 to transmit the row address RA and the column address CA to the row decoder 22 and the column decoder 24, respectively.

The row decoder 22 selectively activates a word line WL of the memory array 10 according to the row address RA to perform row selection. The column decoder 24 performs column selection in the memory array 10 according to the column address CA.

The sense amplifier and input/output control circuit 30 performs read/write of data on a memory cell selected by an address signal through a bit line BL corresponding to a memory cell selected by the column decoder 24.

The data input buffer 40 catches data EXTDQ inputted to the data terminal 18 from the outside at a timing in synchronization with the internal clock CLK to output the data EXTDQ to the sense amplifier and input/output control circuit 30.

The data output buffer 50 outputs read data transmitted from the sense amplifier and input/output control circuit 30 to the outside through the data terminal 18 in data read.

The synchronous semiconductor memory device 1 further includes a CLK buffer 60; and a DLL circuit 100.

The CLK buffer 60 generates an internal clock CLK in response to the external clock EXTCLK inputted to the clock terminal 16. The internal clock CLK is transmitted to the control circuit 15; the address buffer 20; the data input buffer 40 and others. By controlling operating timings of the internal circuits in response to the internal clock CLK with the control circuit 15, the synchronous semiconductor memory device 1 can be operated in synchronization with the external clock EXTCLK.

The DLL circuit 100 generates a control clock DLLCLK on the basis of the external clock EXTCLK inputted to the clock terminal 16. A phase of the control clock DLLCLK is controlled by the DLL circuit 100 such that the access time tAC satisfies the specification for data output timing.

Figure 2:
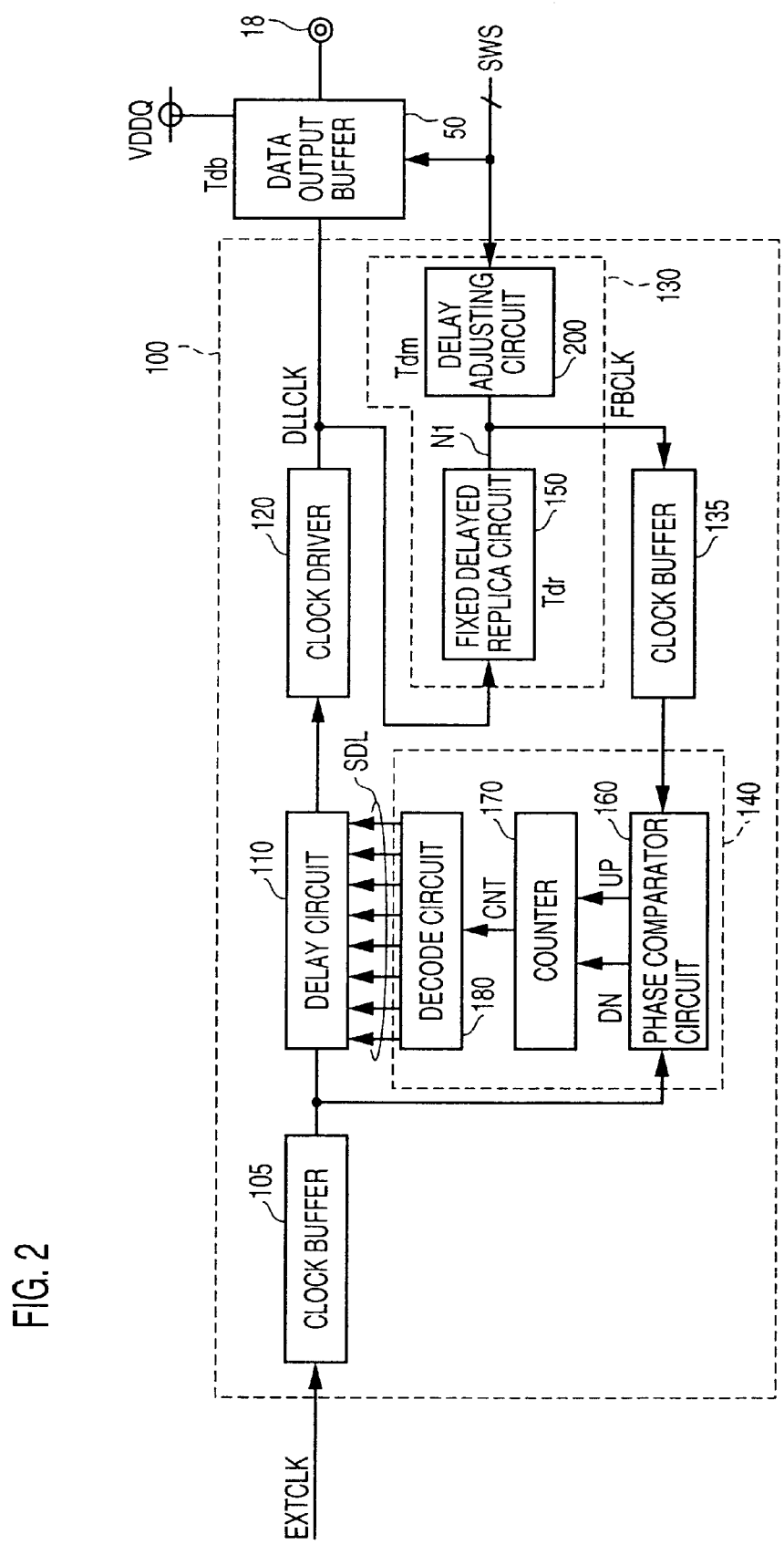
FIG. 2 is a block diagram representing a configuration of a DLL circuit shown in FIG. 1.

Referring to FIG. 2, the DLL circuit 100 includes: a clock buffer 105; a delay circuit 110; a clock driver 120; a replica delay time adjusting section 130; a clock buffer 135; and a phase control section 140.

The clock buffer 105 receives the external clock EXTCLK from the clock terminal 16 to perform buffering. The delay circuit 110 delays output from the clock buffer 105 by a delay time corresponding to a delay control signal SDL. Setting of the delay time in the delay circuit 110 can be performed in a discrete form or in a continuous form.

The clock driver 120 receives output of the delay circuit 110 to generate the control clock DLLCLK. The control clock DLLCLK is transmitted to the data output buffer 50.

The data output buffer 50 receives supply of an operating power source voltage VDDQ to operate. A data output processing by the data output buffer 50 is activated at a timing responsive to the control clock DLLCLK. A setting of a word organization in the synchronous semiconductor memory device 1 is transmitted to the data output buffer 50 by a word organization signal SWS. A processing time Tdb required for data output processing in the data output buffer 50 alters according to the setting of a word organization.

The replica delay time adjusting section 130 adjusts a delay time of the feed back clock FBCLK behind the control clock DLLCLK according to the setting of a word organization.

The replica delay time adjusting section 130 includes: a fixed delayed replica circuit 150; and a delay adjusting circuit 200. The fixed delayed replica circuit 150 delays the control clock DLLCLK by a fixed replica delay time Tdr to output the delayed control clock to a node N1 as the feedback clock FBCLK. The fixed replica delay time Tdr is a fixed value set in correspondence with a processing time of the data output buffer 50 in a case where a word organization is set to the minimum number of bits in a selectable range (a case of a word organization ×4 for the synchronous semiconductor memory device).

The delay adjusting circuit 200 is coupled to the node N1 and adjusts the feedback clock FBCLK to further delay an adjusted replica delay time Tdm. The adjusted replica delay time Tdm is set variably according to the word organization signal SWS.

The clock buffer 135 performs buffering of the feedback clock FBCLK.

The phase control section 140 includes: a phase comparator circuit 160; a counter 170; and a decode circuit 180.

The phase comparator circuit 160 compares, in phase, the external clock EXTCLK and feedback clock FBCLK transmitted through the clock buffers 105 and 135, respectively, with each other. The phase comparator circuit 160 activates a control signal DN for reducing a delay time in the delay circuit 110 when the feedback clock FBCLK lags behind the external clock EXTCLK in phase, while on the other hand, the phase comparator circuit 160 activates a control signal UP for increasing a delay time in the delay circuit 110 when the feedback clock FBCLK leads the external clock EXTCLK in phase.

The counter 170 generates a count value CNT according to the control signals DN and UP selectively activated by the phase comparator circuit 160. For example, the count value CNT is incremented one by one in response to activation of the control signal DN and decremented one by one in response to activation of the control signal UP.

The decode circuit 180 generates a delay control signal SDL for setting a delay time in the delay circuit 110 according to a count value CNT from the counter 170. With such a phase synchronous loop formed, a delay time of the delay circuit 110 is controlled such that a phase difference of the feedback clock FBCLK from the external clock EXTCLK is zero.

Figure 3:
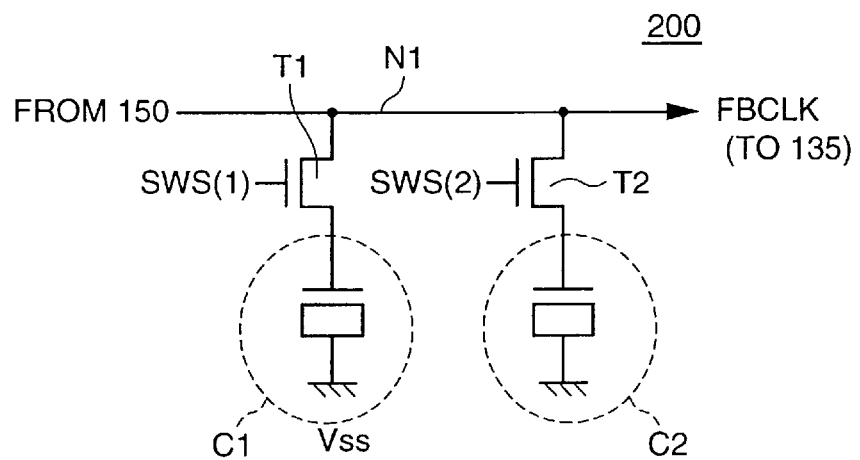
FIG. 3 is a circuit diagram representing a configuration of a delay adjusting circuit shown in FIG. 2.

Referring to FIG. 3, the delay adjusting circuit 200 includes: a node N1 to which the feedback clock FBCLK transmitted; a transistor switch Ti and a delay capacitor C1 coupled in series between the node N1 and the ground voltage Vss. The delay adjusting circuit 200 further includes a pair of a transistor switch T2 and a delay capacitor C2 connected in parallel to a pair of the transistor switch Ti and the delay capacitor C1. With MOS capacitors formed, for example, by capacitors of field effect transistors as the delay capacitors C1 and C2, both the delay capacitances can be efficiently distributed on the semiconductor substrate.

The word organization setting signal SWS shown in FIG. 2 is a 2 bit signal for indicating which of word organizations of ×4, ×8 and ×16 is set. The 2 bits constituting a word organization setting signal SWS is expressed as SWS(1) and SWS(2), respectively. In the synchronous semiconductor memory device 1, in a case of a word organization ×4, both of the SWS(1) and SWS(2) are deactivated; in a case of a word organization of ×8, not only are the SWS (1) activated, but also the SWS (2) is deactivated; and in a case of a word organization of ×16, both of the SWS(1) and the SWS(2) are activated.

Hence, in the case where a word organization is ×4, the transistor switches T1 and T2 are both turned off. In the case where a word organization is ×8, the transistor switch Ti is turned on, while the transistor switch T2 is turned off. In the case where a word organization is ×16, the transistor switches T1 and T2 are both turned on.

Therefore, in cases where word organizations are set to ×4, ×8 and ×16, a delay capacitance added to the node N1 by the delay adjusting circuit 200 are set to 0, C1 and (C1+C2), respectively.

Capacitance values of the delay capacitors C1 and C2 are designed such that the adjusted replica delay time Tdm (×N) given by the delay capacitors C1 and C2 satisfy the following formula (1), using a fixed replica delay time Tdr and a processing time Tdb (×N) in the data output buffer 50 in a case where a word organization are set to ×N.

$$Tdb (\times N) = Tdr + Tdm (\times N) \qquad (1)$$

As described already, the fixed replica delay time Tdr is determined in correspondence to a processing time Tdb (×4) of a data output buffer in a case of a word organization of ×4. Furthermore, in a case of a word organization of ×4, the transistor switches T1 and T2 are both turned off; therefore, Tdm (×4)=0.

Hence, a total sum of delay times by the replica delay time adjusting section 130, that is a phase lag of the feedback clock FBCLK behind the control clock DLLCLK can be properly set by the adjusted replica delay times Tdm (×8) and Tdm (×16) given by the delay capacitors C1 and C2, even if the word organization is altered, in correspondence to increments of a processing time Tdb of the output buffer 50 (ΔTdb1 and ΔTdb2 shown in FIG. 13) in cases where word organizations are set to ×8 and ×16, respectively,.

Figure 4:
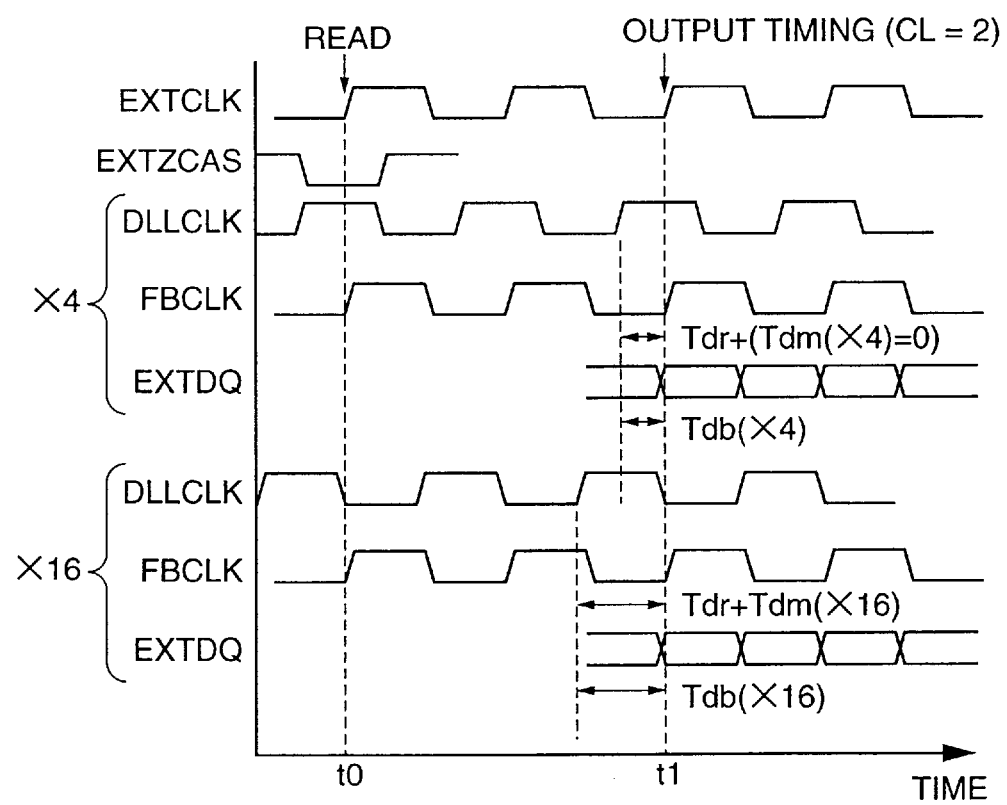
FIG. 4 is a timing chart describing a data output timing of the synchronous semiconductor memory device according to a first embodiment.

In FIG. 4, shown is a timing chart describing a data output timing of the synchronous semiconductor memory device 1 according to a first embodiment. Setting of a column latency is two clock cycles (CL=2) in the synchronous semiconductor memory device 1 as well.

Figure 13:
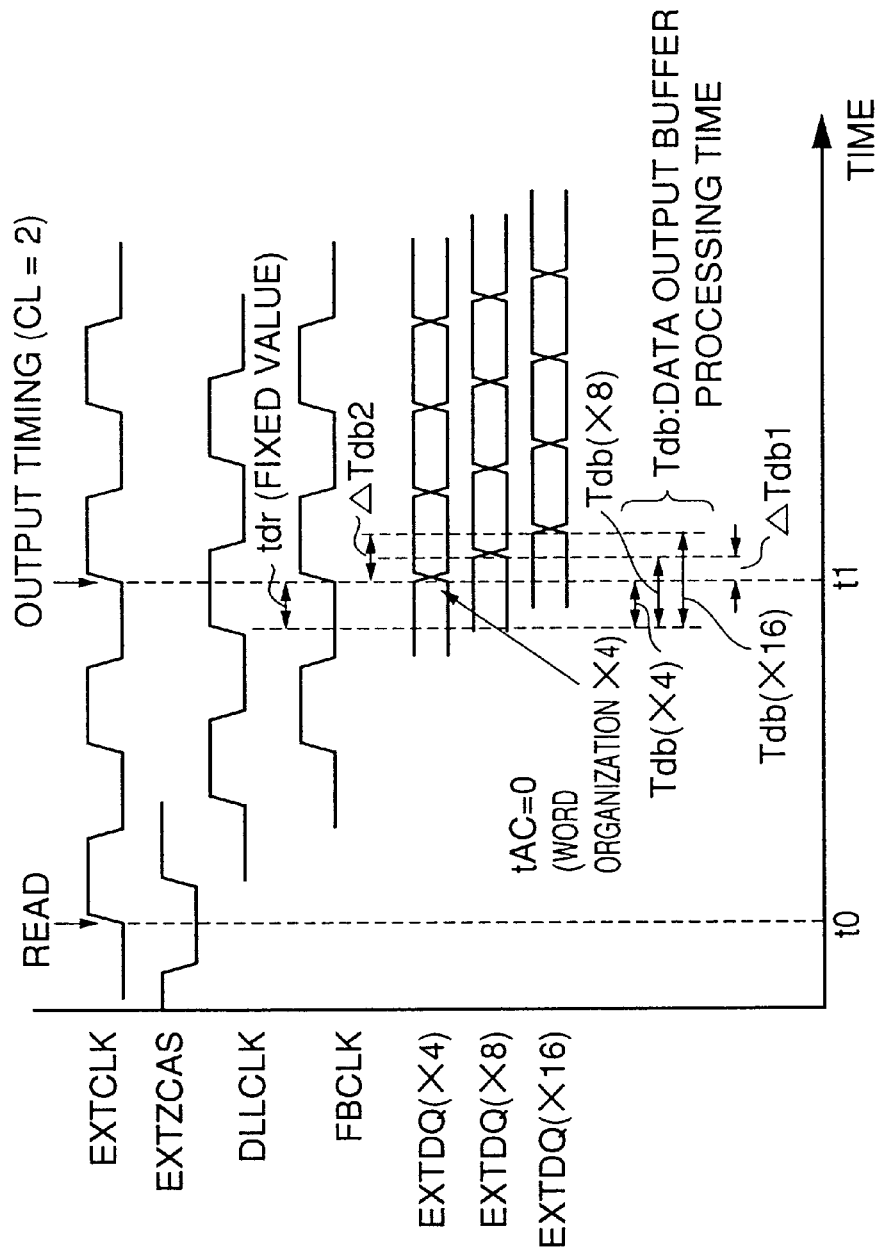
FIG. 13 is a timing chart for describing a data output operation of a general synchronous semiconductor memory device.

Referring to FIG. 4, a read command READ, as is similar to the case of FIG. 13, is caught in synchronization with a rise timing of the external clock EXTCLK at a time point t0. In correspondence to this, requested is data output at a time point ti when a 2 clock cycles time of the external clock EXTCLK elapses.

As described already, the DLL circuit 100 performs phase control such that the external clock EXTCLK and the feedback clock FBCLK are synchronized with each other. A phase of the feedback clock FBCLK lags behind that of the control clock DLLCLK for instructing an operating timing of the data output buffer 50 by a delay time Tdr+Tdr (×N) given by the replica delay time adjusting section 130 shown FIG. 2.

As shown in FIG. 4, processing time periods of the data output buffer 50 corresponding to the cases of respective word organizations of ×4 and ×16 are Tdb (×4) and Tdb (×16) and the processing time period becomes longer as the number of bits of a word organization increases.

However, on one hand, in a case of a word organization of ×4 bit, the adjusted replica delay time Tdm set by the replica delay adjusting section 130 is set to Tdm (×4)=0 in correspondence to the word organization setting signal SWS reflecting setting of the word organization, while on the other hand, in a case where a word organization is set to ×16 and a processing time in the data output buffer 50 increases, an increase to Tdm (×16) is performed.

Hence, a delay time of the control clock DLLCLK behind the feedback clock FBCLK can be properly adjusted, reflecting a change in processing time of the data output buffer 50 corresponding to a word organization; therefore, an data output timing can be properly maintained even if setting of a word organization alters. As a result, a margin of an access time tAC in connection to a data output timing can be secured.

Second Embodiment

Description will be given of a variation of circuit configuration of a delay adjusting circuit in the following embodiment.

Figure 5:
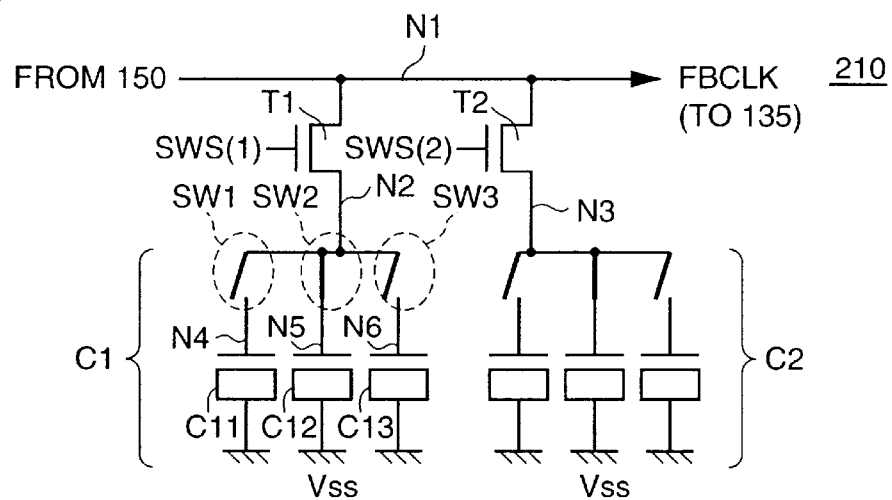
FIG. 5 is a circuit diagram representing a delay adjusting circuit according to a second embodiment.

Referring to FIG. 5, in a delay adjusting circuit 210 according to the second embodiment, the transistor switches T1 and T2 are connected between the node N1 and each of respective nodes N2 and N3. The transistor switches T1 and T2 are turned on in response to activation of SWS(1) and SWS(2), respectively, constituting delay time setting signals as is similar to the delay adjusting circuit 200 shown in FIG. 3.

Between the node N2 and the ground voltage Vss, a plurality of subdelay capacitors C11, C12 and C13 are provided and switch sections are provided in series with the respective sub-delay capacitors. For example, the switch sections SW1, SW2 and SW3 are provided between the nodes N2 and N3, between nodes N2 and N4 and between nodes N2 and N5, respectively.

The sub-delay capacitors C11, C12 and C13 are provided between the node N3 and the ground voltage Vss, between the node N4 and the ground voltage Vss and between the node N5 and the ground voltage Vss.

The sub-delay capacitors C11, C12 and C13 and the switch sections SW1, SW2 and SW3 constitute a portion corresponding the delay capacitor C1 shown in FIG. 3.

Figure 6A:
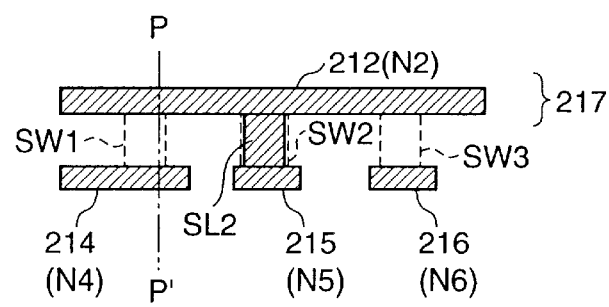
FIGS. 6A and 6B are structural views for describing a structure of a switch section shown in FIG. 5.

FIG. 6A is a top plan view of the switch sections SW1 to SW3 provided on a semiconductor substrate.

Referring to FIG. 6A, interconnects 212, 214, 215 and 216 are formed in the same interconnection layer on the semiconductor substrate correspondingly to the nodes N2, N4, N5 and N6.

Regions corresponding to the switch sections SW1, SW2 and SW3 are secured between the interconnects 212 and 214, between the interconnects 212 and 215 and between the interconnects 212 and 216, respectively.

Figure 6B:
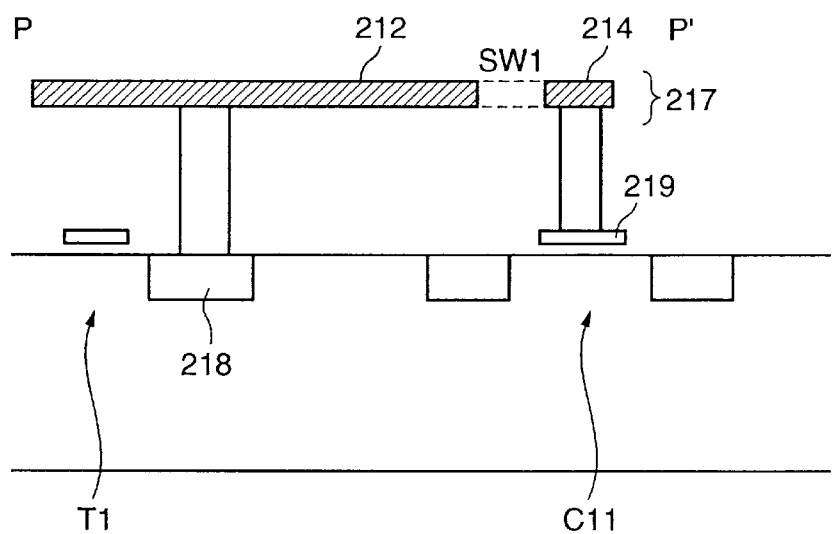

FIG. 6B is a sectional view taken along line P–P' of FIG. 6A.

Referring to FIG. 6B, the interconnect 212 corresponding to the node N2 is formed in an interconnection layer 217. The interconnect 212 is electrically coupled to a source/drain region 218 of the transistor switch T1 through a contact hole. Though not shown, the other source/drain region of the transistor switch T1 is electrically coupled to an interconnect corresponding to the node N1 through a contact hole.

The interconnect 214 corresponding to the node N4 is disposed in the same interconnection layer 217 as is the interconnect 212 and electrically coupled to a gate 219 of a MOS transistor constituting the sub-delay capacitor C11. A region corresponding to the switch section SW1 is secured in the same interconnection layer 217 as are the interconnects 212 and 214 between the interconnects 212 and 214. The switch sections SW2 and SW3 are provided in a similar way.

With such a structure adopted, a delay capacitance value added to the node N2 can be altered by selecting the presence or absence of interconnect formation in the interconnection layer 217 in the switch sections SW1 to SW3. While in FIG. 6A, shown is an example in which an interconnect SL2 is formed only in the switch section SW2, in this case only the sub-delay capacitance C12 is added to the node N1 in response to turning-on of the transistor switch T1.

Such selection of the presence or absence of interconnect formation in each of the switch sections SW1 to SW3 can be altered with ease by setting a mask pattern for forming an interconnection layer in a fabrication process.

Therefore, if capacitance values of the sub-delay capacitors C11 to C13 are designed to be values different from each other, fine adjustment of a capacitance value of a delay capacitor actually fabricated can be achieved by a change of a mask pattern even when the capacitance value of a delay capacitor actually fabricated is greatly deviated from a design value compared with the configuration of the delay adjusting circuit 200 shown in FIG. 3.

The delay capacitance C2 provided correspondingly to the transistor switch T2 can also be of structure similar to the case of the delay capacitor C1.

As a result, more of a margin of a data output timing can be secured so as to cope with dispersions of parameters occurring in a fabrication process.

Third Embodiment

Figure 7:
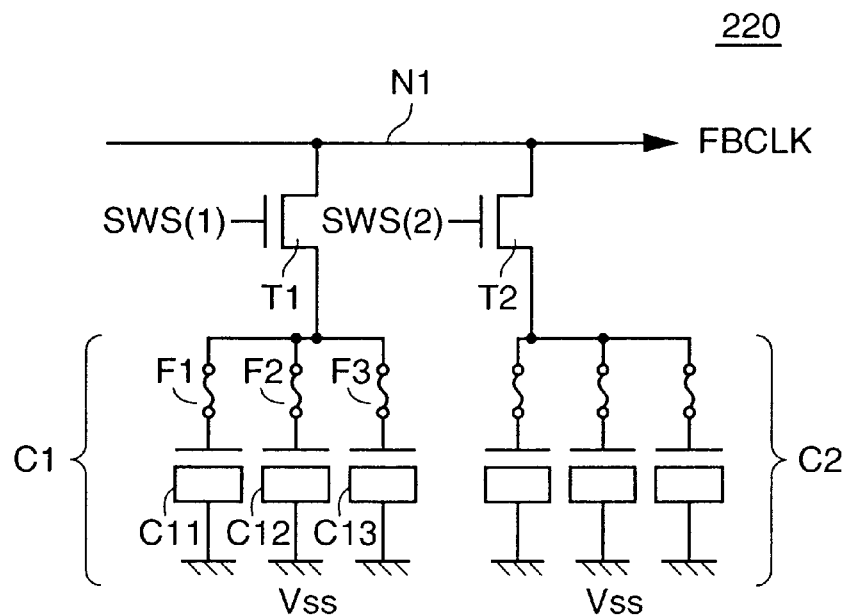
FIG. 7 is a circuit diagram representing a configuration of a delay adjusting circuit according to a third embodiment.

Referring to FIG. 7, a delay adjusting circuit 220 according to the third embodiment is different from the delay adjusting circuit 210 shown in FIG. 5 when compared in that fuse elements F1 to F3 are disposed instead of the switch sections SW1 to SW3. The other portion of the configuration is similar to a corresponding portion of the configuration of the delay adjusting circuit 210; therefore no detailed description is repeated.

The fuse elements are blown according to a blow input from the outside to perform electrical disconnection between corresponding interconnects. Fine adjustment of a delay capacitance value in the delay adjusting circuit 220 is performed by selection of the presence or absence of a blow input for each of the fuse elements F1 to F3.

Hence, in the delay adjusting circuit 220, fine adjustment of a capacitance value of delay capacitor can be performed, reflecting a result of a wafer test in a process subsequent to formation of interconnection, while securing a higher degree of freedom.

Note that the fuse elements F1 to F3 each are shown as a typical example of a so-called program element, in which electric coupling or non-coupling between corresponding two interconnects can be set from the outside in a non-volatile manner. Hence, so-called anti-fuse elements or the like can also be used each of which has a reverse characteristic of that of the fuse element: for example, a change occurs from a non-coupling state to a coupling state by blow input.

Note that in the second and third embodiments, it is only by way of example that the number of sub-delay capacitors provided correspondingly to one transistor switch is three and finer adjustment to cope with dispersions of parameters in fabrication process can be achieved by disposing a plurality of sub-delay capacitors and corresponding switch sections or program elements so as to be provided to one transistor switch.

Fourth Embodiment

Figure 8:
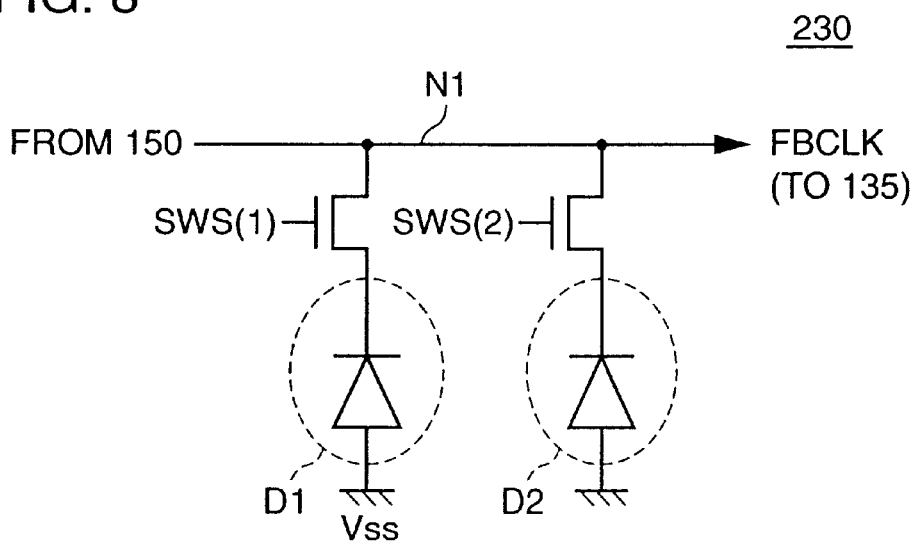
FIG. 8 is a circuit diagram representing a configuration of a delay adjusting circuit according to a fourth embodiment.

Referring to FIG. 8, a delay adjusting circuit 230 according to the fourth embodiment is different from the delay adjusting circuit 200 shown in FIG. 3 when compared in that diodes D1 and D2 are disposed instead of the delay capacitors C1 and C2, each of which is aMOS capacitor. The other portion of the configuration is similar to a corresponding portion of the configuration of the delay adjusting circuit 200; therefore, no detailed description is repeated.

In the delay adjusting circuit 230, delay capacitors are formed by PN junction capacitors of the diodes D1 and D2. With such a configuration as well, delay capacitors can be efficiently formed on a semiconductor substrate.

Fifth Embodiment

Figure 9:
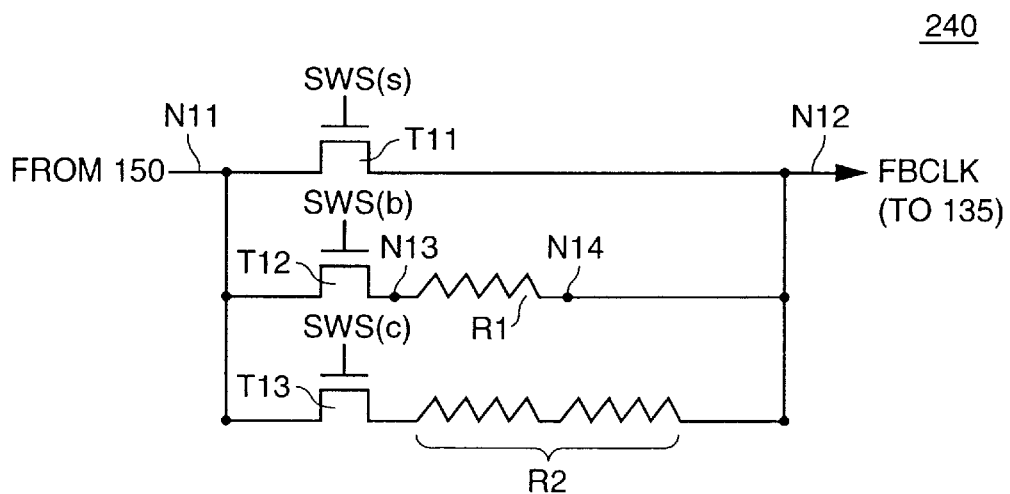
FIG. 9 is a circuit diagram representing a configuration of a delay adjusting circuit according to a fifth embodiment.

Referring to FIG. 9, a node N11 is electrically coupled to the output side of a fixed delayed replica circuit 150. A node N12 is electrically coupled to the input side of a clock buffer 135. The delay adjusting circuit 240 is disposed between the nodes N11 and N12.

The delay adjusting circuit 240 includes transistor switches T1 1 to T13 and delay resistors R1 and R2.

The transistor switch T1 is directly coupled between the nodes N11 and N12 without a specific delay resistor interposing between the transistor switch and a node. The transistor switches T12 and T13 are electrically coupled between the nodes N11 and N12 with delay resistors R1 and R2 interposing between each of the respective transistor switches T12 and T13 and the nodes N11 and N12.

The delay resistors R1 and R2 can be efficiently arranged on a semiconductor substrate, for example, by using interconnects formed in an interconnection layer, P/N diffused resistances and others.

In the fifth embodiment, the word organization setting signal SWS is a signal having three bits for indicating which of word organizations of ×4, ×8 and ×16 is set, wherein the three bits constituting the word organization setting signal SWS are expressed SWS(a), SWS(b) and SWS (c), respectively. In the fifth embodiment, only the SWS(a) is activated in a case of a word organization of ×4, only the SWS (b) is activated in a case of a word organization of ×8 and only the SWS (c) is activated in a case of a word organization of ×16.

The transistor switches T11, T12 and T13 are turned on/off in response to SWS(a), SWS(B) and SWS(c), respectively, constituting the word organization setting signal SWS.

Therefore, in a case of a word organization of ×4, only the transistor switch T1 is turned on; in a case of a word organization of ×8, only the transistor switch T12 is turned on; and in a case of a word organization of ×16, only transistor switch T13 is turned on.

Hence, delay resistors selectively connected between the nodes N11 and N12 by the delay adjusting circuit 240 are set to 0, R1 and R2 (R2 >R1) in correspondence to cases where a word organization is set to ×4, ×8 and ×16, respectively.

Resistance values of the resistors R1 and R2 are designed such that the formula (1) is satisfied as is similar to the delay capacitors C1 and C2 in FIG. 3.

Hence, a total sum of delay times by the replica delay time adjusting section 130, that is a phase lag of the feedback clock FBCLK behind the control clock DLLCLK can be properly set by the adjusted replica delay times Tdm (×8) and Tdm (×16) given by the delay capacitors R1 and R2, even if the word organization is altered, in correspondence to increments of a processing time Tdb of the output buffer 50 (ΔTdb1 and ΔTdb2 shown in FIG. 13) in cases where word organizations are set to ×8 and ×16, respectively,.

Sixth Embodiment

Figure 10:
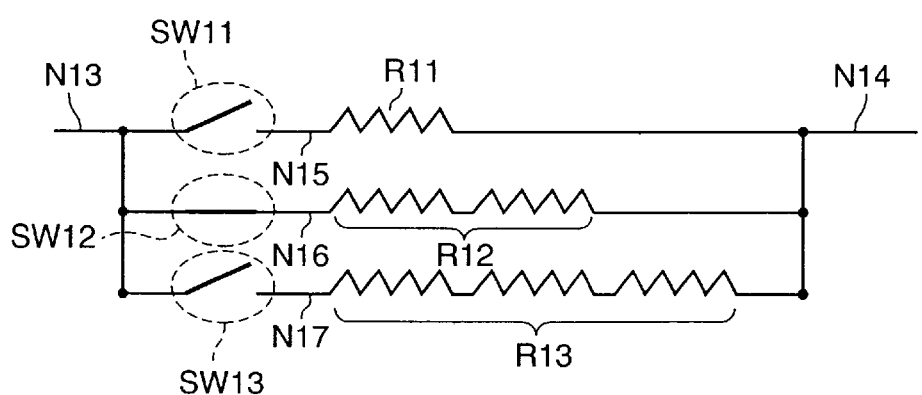
FIG. 10 is a circuit diagram representing a configuration of a delay resistor according to a sixth embodiment.

FIG. 10 is a circuit diagram representing a configuration of a delay resistor according to a sixth embodiment. In FIG. 10, typically shown is a configuration of the delay resistor R1 shown in FIG. 9.

Referring to FIGS. 9 and 10, both ends of the delay resistor R1 are connected to respective nodes N13 and N14. The node N13 is coupled to the transistor switch T12 and the node N14 is coupled to the node N12.

A plurality of sub-delay registers R11, R12 and R13 are connected between the node N14 and a node N15, between the node N14 and a node N16, and between the node N14 and a node N17, respectively. Switch sections are provided in series with the respective sub-delay resistors R11, R12 and R13. For example, switch sections SW11, SW12 and SW13 are provided between the nodes N13 and N15, between the nodes N13 and N16, and between the nodes N13 and N17, respectively.

Figure 11A:
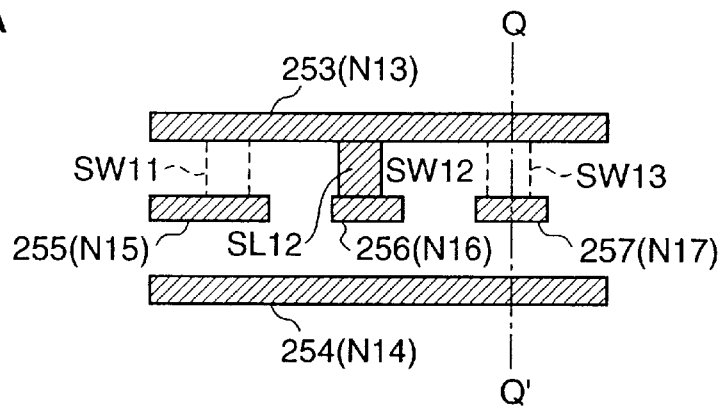
FIGS. 11A and 11B are structural views for describing a structure of a switch section shown in FIG. 10.

FIG. 11A is a top plan view of the switch sections SW11 to SW13 provided on a semiconductor substrate.

Referring to FIG. 11A, interconnects 253, 254, 255, 256 and 257 are formed in the same interconnection layer on the semiconductor substrate in correspondence to the respective nodes N13, N14, N15, N16 and N17.

Regions corresponding to the switch sections SW11, SW12 and SW13 are secured between interconnects 253 and 255, between interconnects 253 and 256, and between interconnects 253 and 257, respectively.

Figure 11B:
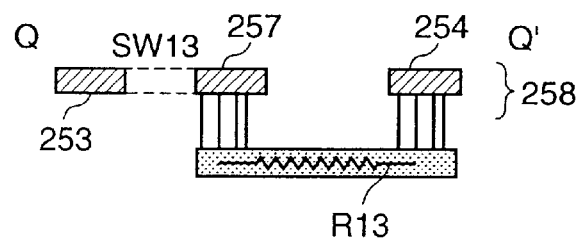

FIG. 11B is a sectional view taken along line Q–Q' in FIG. 11A.

Referring to FIG. 11B, the interconnect 253 corresponding to the node N13 is formed in an interconnection layer 258. The interconnects 254 and 257 are formed in the same interconnection layer 258 as is the interconnect 253 and are electrically coupled to respective both ends of the sub-delay resistor R13 through contact holes. The switch sections SW1 and SW12 are also fabricated in a similar manner to the case of the switch section SW13.

With such a structure adopted, a delay resistance value connected between the nodes N1 and N2 can be altered in response to turning-on of the transistor switch T12 through selecting the presence or absence of formation of interconnection in the interconnection layer 258 in the switch sections SW11 to SW13. While in FIG. 11A, shown is an example in which the interconnect SL12 is formed only in the switch section 12, in this case only the sub-delay resistor R12 is connected between the nodes N1 and N2 in response to turning-on of the transistor switch T12.

Such selection of the presence or absence of formation of interconnection in each of the switch sections SW11 to SW13 can be altered with ease by setting a mask pattern for forming an interconnection layer in a fabrication process.

Hence, if resistance values of the sub-delay resistors R11 to R13 are designed so as to be different from each other, a resistance value of a delay resistor actually fabricated can receive finer adjustment of the resistance value itself by alteration of a mask pattern even when being deviated from a design value when compared with the case of the delay adjusting circuit 240 shown in FIG. 9.

The delay resistor R2 disposed in correspondence to the transistor switch T13 can be also of structure similar to the case of the delay resistor R1.

As a result, a more of margin for a data output timing can be secured, further coping with dispersions of parameters occurring a fabrication process.

Seventh Embodiment

Figure 12:
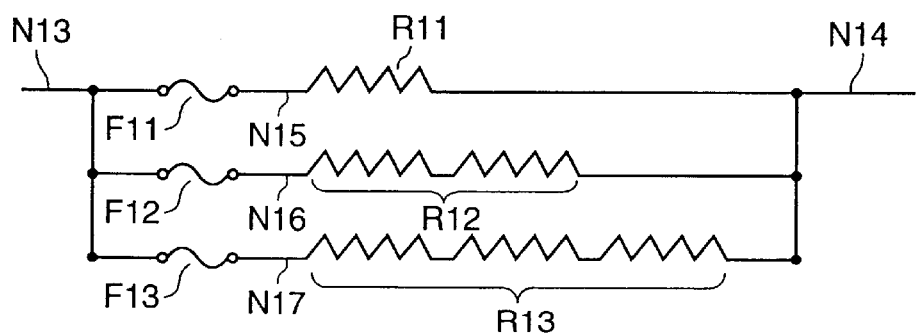
FIG. 12 is a circuit diagram representing a configuration of a delay resistor according to a seventh embodiment.

Referring to FIG. 12, a delay resistor according to the seventh embodiment is different from the delay resistor according to the sixth embodiment shown in FIG. 10 when compared in that fuse elements F11 to F13 are used instead of the switch sections SW11 to SW13. The other portion of the configuration is similar to a corresponding portion of the configuration of the delay resistor shown in FIG. 10; therefore, no detailed description is repeated.

The fuse elements are blown by blow input from the outside to perform electrical disconnection between corresponding two interconnects as is similar to the case of the fuse elements F1 to F3 shown in FIG. 7. Fine adjustment of a delay resistance value of a delay resistor according to the seventh embodiment is performed by selection of the presence or absence of blow input to each of the fuse elements F11 to F13.

Therefore, in a configuration according to the seventh embodiment, fine adjustment of a delay capacitance value of a delay capacitor can be performed in a step subsequent to formation of interconnection, reflecting a result of a wafer test while securing a higher degree of freedom.

Note that each of the fuse elements F11 to F13 is shown as a typical example of a so-called program element similarly to the case of the fuse elements F1 to F3. Therefore, so-called anti-fuse elements and others can also be employed.

Note again that in the sixth and seventh embodiments, it is by way of example only that the number of delay resistors provided correspondingly to one transistor switch is three, there can be arranged a plurality of delay resistors, which is not specific to any number, and corresponding switch sections or program elements to one transistor switch, thereby enabling finer adjustment to cope with dispersions of parameters of a fabrication process.

Note still again that while a word organization is selectively set to one of ×4, ×8 and ×16 in the synchronous semiconductor memory device 1 according to the embodiments of the present invention, a select range of word organizations can be further extended. In such cases as well, the present invention can be applied if the word organization setting signal SWS is properly set such that a selected word organization can be uniquely indicated.

Furthermore, while in the embodiments of the present invention, a word organization is taken up as a typical example of an operating condition altering a processing time of the data output buffer 50, the present invention can also be applied by taking up a different operating condition that serves as a factor changing the processing time. In such a case as well, a similar effect can be achieved, if a selected operating condition can be indicated by providing a control signal corresponding to the word organization setting signal SWS.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with an external clock comprising:
   a data output buffer circuit for performing an output operation of read data to the outside requiring a processing time corresponding to an operating condition; and
   a control clock generating circuit for generating a control clock activating said output operation of said data output buffer circuit according to said external clock,
   said control clock generating circuit including:
      a delay circuit for delaying said external clock to generate said control clock,
      a delay control section controlling a delay time in said delay circuit according to a phase difference between said external clock and a feedback diclock, and
      a replica delay time adjusting section, provided between said delay circuit and said delay control circuit, and for delaying said control clock by a replica delay time corresponding to said processing time to generate said feedback clock, and said replica delay time adjusting section adjusting said replica delay time according to said operating condition.

2. The synchronous semiconductor memory device according to claim 1, wherein said operating condition sets the number of bits of data communicated in a one time data input and output operations.

3. The synchronous semiconductor memory device according to claim 1, wherein said replica delay time adjusting section comprises:

a fixed delay circuit for delaying said control clock by a fixed first delay time; and a delay adjusting section for further delaying said control clock by a second delay time according to said operating condition.

4. The synchronous semiconductor memory device according to claim 3, wherein said operating condition sets the number of bits of data communicated in a one time data input and output operations and said first delay time is set in correspondence to said processing time in a case where said number of bits is set to the minimum.

5. The synchronous semiconductor memory device according to claim 1, wherein said replica delay time adjusting section comprises:

a delay capacitor for delaying said control clock; and a switch circuit electrically coupled between a node transmitting said control clock and said delay capacitor, and said switch circuit is turned on or off according to said operating condition.

6. The synchronous semiconductor memory device according to claim 5, wherein said delay capacitor includes a capacitor formed by a field effect transistor.

7. The synchronous semiconductor memory device according to claim 5, wherein said delay capacitor comprises: a PN junction capacitor formed on a semiconductor substrate.

8. The synchronous semiconductor memory device according to claim 5, wherein said delay capacitor comprises:

a plurality of sub delay capacitors formed on a semiconductor substrate;

a plurality of first interconnects electrically coupled to said plurality of sub delay capacitors, respectively, and formed in the same interconnection layer on said semiconductor substrate;

a second interconnect formed in said same interconnection layer and coupled to said node through said switch circuit; and a third interconnect selectively formed in at least one of a plurality of regions of said same interconnection layer, corresponding to between each of said plurality of first interconnects and said second interconnect.

9. The synchronous semiconductor memory device according to claim 5, wherein said delay capacitor comprises:

a plurality of sub delay capacitors formed on a semiconductor substrate;

a plurality of first interconnects electrically coupled to said respective plurality of sub delay capacitors;

a second interconnect coupled to said node through said switch circuit; and a plurality of program elements electrically coupled between of said plurality of first interconnects and said second interconnect, respectively, and selection of electrical coupling or non-coupling in said plurality of program elements between corresponding one of said plurality of first interconnects and said second interconnect is externally set in a nonvolatile manner.

10. The synchronous semiconductor memory device according to claim 1, wherein said replica delay time adjusting section comprises:

a plurality of delay resistors connected in parallel between a first node to which said control clock is transmitted and a second node from which said feedback clock is generated; and a plurality of first switch circuits provided corresponding to said plurality of delay resistors, respectively, and turned on or off according to said operating condition, and each of said first switch circuits is electrically coupled between one of said first and second nodes and a corresponding one of said plurality of delay resistors.

11. The synchronous semiconductor memory device according to claim 10, wherein said replica delay time adjusting section further comprises: a second switch circuit coupled directly between said first node and said second node and turned on or off according to said operating condition.

12. The synchronous semiconductor memory device according to claim 10, wherein each of said plurality of delay resistors comprises:

a plurality of sub delay resistors formed on a semiconductor substrate;

a plurality of first interconnects electrically coupled to said plurality of sub delay resistors, respectively, and formed in the same interconnection layer on said semiconductor substrate;

a second interconnect formed in said same interconnection layer and coupled to said one of said first and second nodes through said first switch circuit; and a third interconnect selectively formed in at least one of a plurality of regions of said same interconnection layer, corresponding to between each of said plurality of first interconnects and said second interconnect.

13. The synchronous semiconductor memory device according to claim 10, wherein each of said plurality of delay resistors comprises:

a plurality of sub delay resistors formed on a semiconductor substrate;

a plurality of first interconnects electrically coupled to said plurality of sub delay resistors, respectively;

a second interconnect formed in said same interconnection layer and coupled to said one of said first and second nodes through said first switch circuit; and a plurality of program elements electrically coupled between each of said plurality of first interconnects and said second interconnect, and selection of electrical coupling or non-coupling in said plurality of program elements between corresponding one of said plurality of first interconnects and said second interconnect is externally set in a non-volatile manner.

* * * * *